US009590882B2

United States Patent
Sato et al.

(10) Patent No.: US 9,590,882 B2
(45) Date of Patent: Mar. 7, 2017

(54) FAULT DIAGNOSTIC SYSTEM, FAULT DIAGNOSTIC DEVICE, AND FAULT DIAGNOSTIC METHOD

(71) Applicant: NISSAN MOTOR CO., LTD., Yokohama-shi, Kanagawa (JP)

(72) Inventors: Sho Sato, Yokohama (JP); Shinsuke Yonetani, Machida (JP); Yoshinori Ando, Sagamihara (JP); Hironobu Shimosawa, Isehara (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 1 day.

(21) Appl. No.: 14/415,347

(22) PCT Filed: Jun. 18, 2013

(86) PCT No.: PCT/JP2013/066683
§ 371 (c)(1),
(2) Date: Jan. 16, 2015

(87) PCT Pub. No.: WO2014/013826
PCT Pub. Date: Jan. 23, 2014

(65) Prior Publication Data
US 2015/0180754 A1      Jun. 25, 2015

(30) Foreign Application Priority Data
Jul. 20, 2012   (JP) ................................. 2012-161423

(51) Int. Cl.
*H04L 12/26*   (2006.01)
*B60L 3/00*   (2006.01)
(Continued)

(52) U.S. Cl.
CPC .......... *H04L 43/0823* (2013.01); *B60L 3/003* (2013.01); *B60L 3/0046* (2013.01);
(Continued)

(58) Field of Classification Search
CPC .............. H04L 69/40; G01R 19/16542; G01R 19/2503; H02M 7/48; H04Q 2209/43; H04Q 9/00
See application file for complete search history.

(56) References Cited

U.S. PATENT DOCUMENTS 7,729,827 B2 *   6/2010   Sakurai ............. B60W 50/0205
                                                         370/229
2007/0279068 A1 *  12/2007  Harres ................. G01R 31/088
                                                         324/522

FOREIGN PATENT DOCUMENTS

GB     2 486 684 A    6/2012
JP     11-110039 A    4/1999
(Continued)

*Primary Examiner* — Ian N Moore
*Assistant Examiner* — Brian T Le
(74) *Attorney, Agent, or Firm* — Foley & Lardner LLP

(57) ABSTRACT

A fault diagnostic system (1) of the present invention includes a first fault diagnostic device (3) and a second fault diagnostic device (5). The first fault diagnostic device (3) acquires the voltage value of a battery (2) in accordance with a synchronization signal, and sends the voltage value and the synchronization signal. The second fault diagnostic device (5) acquires the voltage value of an inverter (4) in accordance with the received synchronization signal, matches the acquisition timings of the voltage value of the battery (2) and the voltage value of the inverter (4) on the basis of the received synchronization signal, and performs a fault diagnosis by comparing these voltage values.

12 Claims, 9 Drawing Sheets

(51) Int. Cl.
  *H04Q 9/04* (2006.01)
  *B60L 3/12* (2006.01)
  *B60L 11/18* (2006.01)
  *G08C 25/00* (2006.01)
  *G01R 31/40* (2014.01)

(52) U.S. Cl.
  CPC ............ *B60L 3/12* (2013.01); *B60L 11/1803* (2013.01); *B60L 11/1857* (2013.01); *G08C 25/00* (2013.01); *H04Q 9/04* (2013.01); *B60L 2240/527* (2013.01); *B60L 2240/529* (2013.01); *B60L 2240/545* (2013.01); *B60L 2240/547* (2013.01); *B60L 2240/549* (2013.01); *B60L 2240/80* (2013.01); *G01R 31/40* (2013.01); *Y02T 10/705* (2013.01); *Y02T 10/7005* (2013.01)

(56) References Cited

FOREIGN PATENT DOCUMENTS

| | | |
|---|---|---|
| JP | 2004-88920 A | 3/2004 |
| JP | 2006-176000 A | 7/2006 |
| JP | 2011-15543 A | 1/2011 |

\* cited by examiner

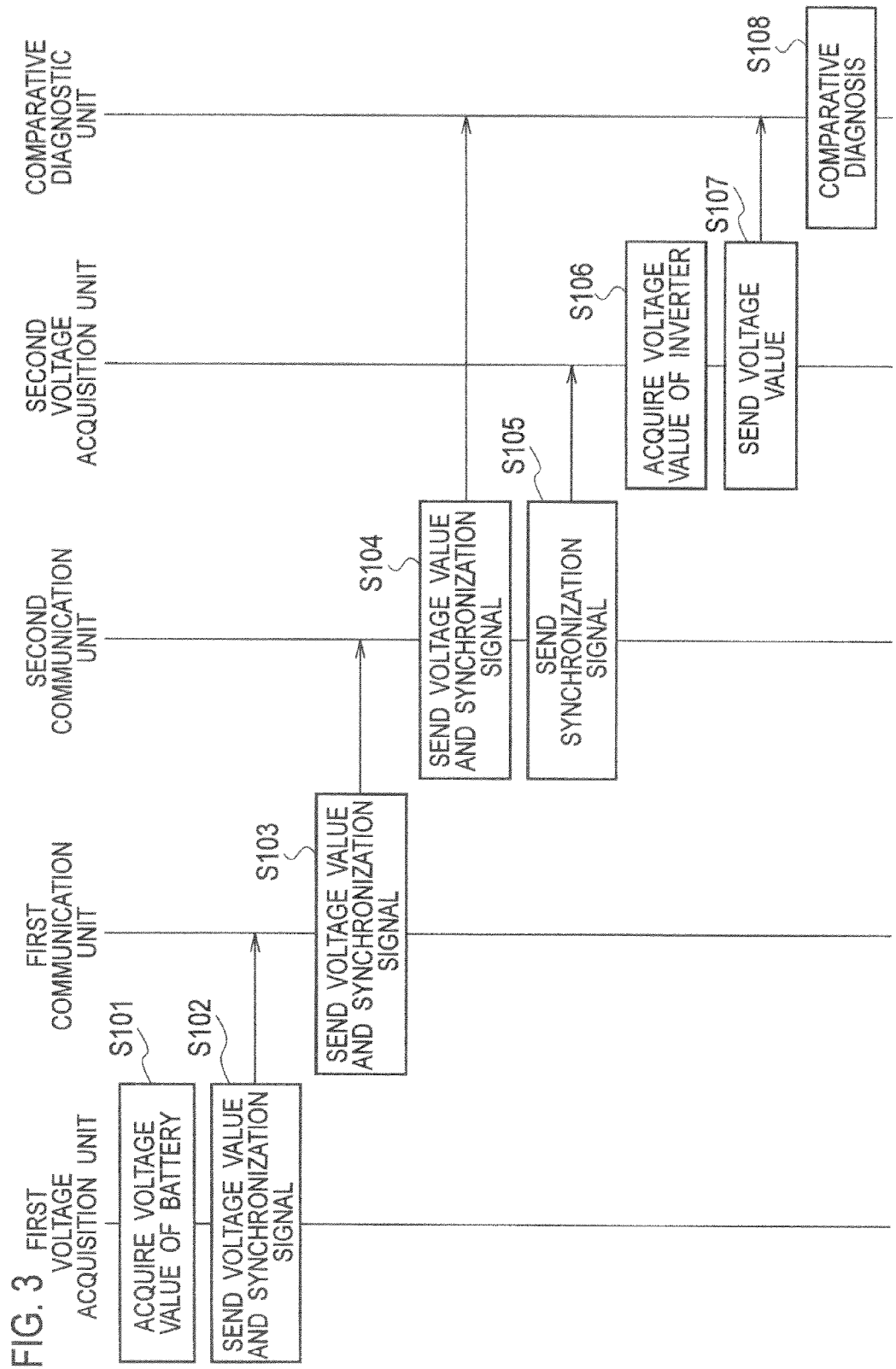

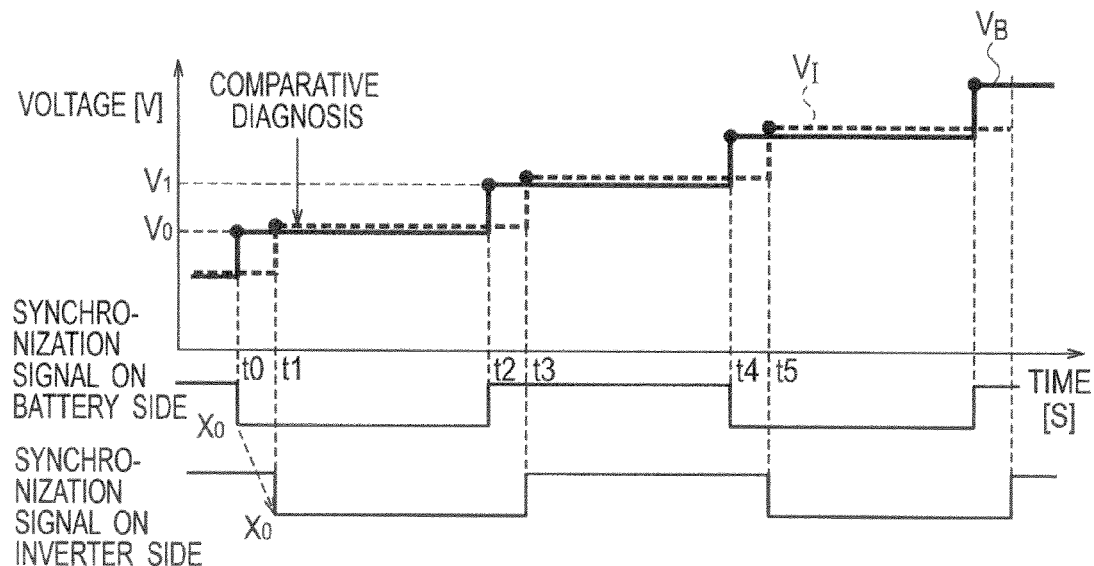
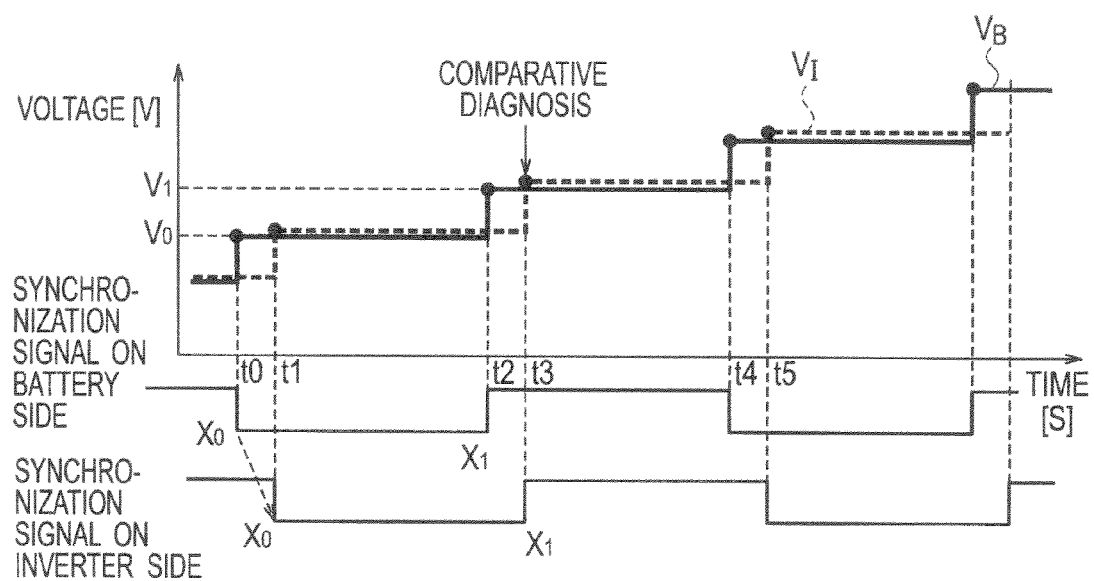

FAULT DIAGNOSTIC SYSTEM, FAULT DIAGNOSTIC DEVICE, AND FAULT DIAGNOSTIC METHOD

TECHNICAL FIELD

The present invention relates to a fault diagnostic system, a fault diagnostic device, and a fault diagnostic method which diagnose a fault between two devices connected by a communication line.

BACKGROUND ART

Patent Literature 1 discloses a technique for detecting an anomaly in a power transmission line for transmitting electric power between two or more terminals. In Patent Literature 1, the location of a fault in the power transmission line is identified in such a way that the two or more terminals detect a current flowing through the power transmission line by sampling based on a sampling synchronization signal in regular cycles, and the detected current values are sent between the two or more terminals and compared.

CITATION LIST

Patent Literature

Patent Literature 1: Japanese Patent Application Publication No. 2004-88920

SUMMARY OF INVENTION

In the above-described conventional devices, the timings of detection of the current values are matched by the terminals using the sampling synchronization signal. However, in some cases, current values detected at different timings are compared due to variations in the times to the sending and receiving of the detected current values between the terminals. For example, if it takes a long time for a terminal to send a detected current value, another terminal receiving the current value compares a current value detected at the latest sampling timing and the current value detected at the previous sampling timing.

Accordingly, in the case where the times to the sending and receiving vary between terminals, pieces of data detected at different timings are compared, and there is a problem that a correct anomaly determination cannot be made.

The present invention has been proposed in light of the above-described problem, and an object of the present invention is to provide a fault diagnostic system, a fault diagnostic device, and a fault diagnostic method which can perform a correct fault diagnosis by comparing pieces of data detected at the same timing.

To solve the above-described problem, in a feature of the present invention, a first fault diagnostic device acquires a first state quantity indicating the state of a first device in accordance with a synchronization signal, and sends the first state quantity and the synchronization signal to a second device through a communication line. A second fault diagnostic device receives the first state quantity and the synchronization signal through the communication line, and acquires a second state quantity indicating the state of the second device in accordance with the received synchronization signal. Then, the acquisition timings of the first state quantity and the second state quantity are matched on the basis of the received synchronization signal, and a fault diagnosis is performed by comparing the first state quantity and the second state quantity of the same acquisition timing.

BRIEF DESCRIPTION OF DRAWINGS

FIG. 3 is a timing chart showing the procedure of a fault diagnostic process performed by the fault diagnostic system according to the first embodiment of the present invention.

FIG. 4 is a view for explaining the relationship between voltage values of a battery and an inverter and a synchronization signal in the fault diagnostic process according to the first embodiment of the present invention.

FIG. 5 is a view for explaining the relationship between voltage values of a battery and an inverter and a synchronization signal in a fault diagnostic process according to a second embodiment of the present invention.

DESCRIPTION OF EMBODIMENTS

Hereinafter, first to sixth embodiments of the present invention will be described with reference to the drawings.

First Embodiment

Configuration of Fault Diagnostic System

Figure 1:
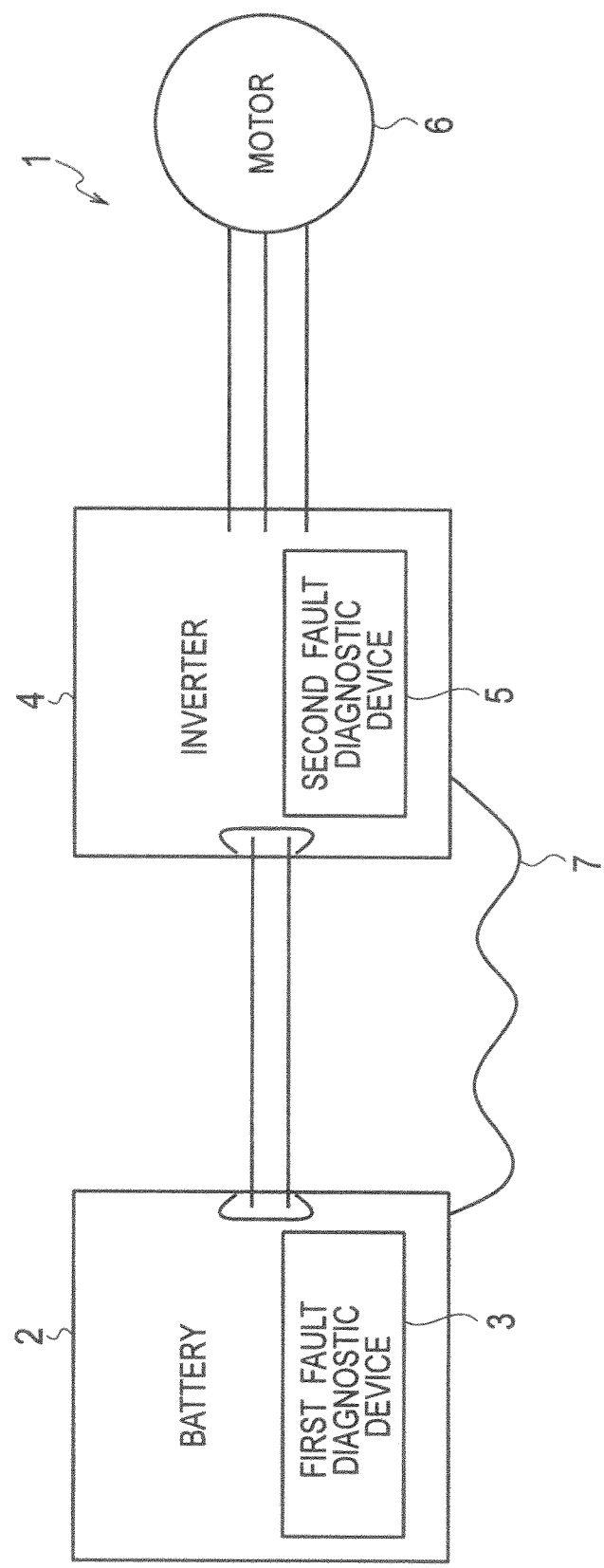
FIG. 1 is a block diagram showing the configuration of a fault diagnostic system according to a first embodiment of the present invention.

The configuration of a fault diagnostic system according to a first embodiment of the present invention will be described with reference to FIG. 1. As shown in FIG. 1, a fault diagnostic system 1 according to this embodiment includes a first fault diagnostic device 3 disposed in a battery 2 corresponding to a first device and a second fault diagnostic device 5 disposed in an inverter 4 corresponding to a second device.

In this embodiment, the case where the fault diagnostic system 1 is applied to a system for driving a motor 6 mounted on a vehicle is illustrated as one example. In the fault diagnostic system 1 according to this embodiment, direct current electricity is supplied from the battery 2 to the inverter 4 through direct current power lines and converted to three-phase alternating current electricity by the inverter 4 to drive the motor 6 through three-phase alternating current power lines. Moreover, communication between the first fault diagnostic device 3 and the second fault diagnostic device 5 is performed through a CAN signal line 7 mounted on the vehicle. It should be noted, however, that the fault diagnostic system 1 according to the present invention is also applicable to other systems, and can be disposed in any system including two devices connected by a communication line.

Figure 2:
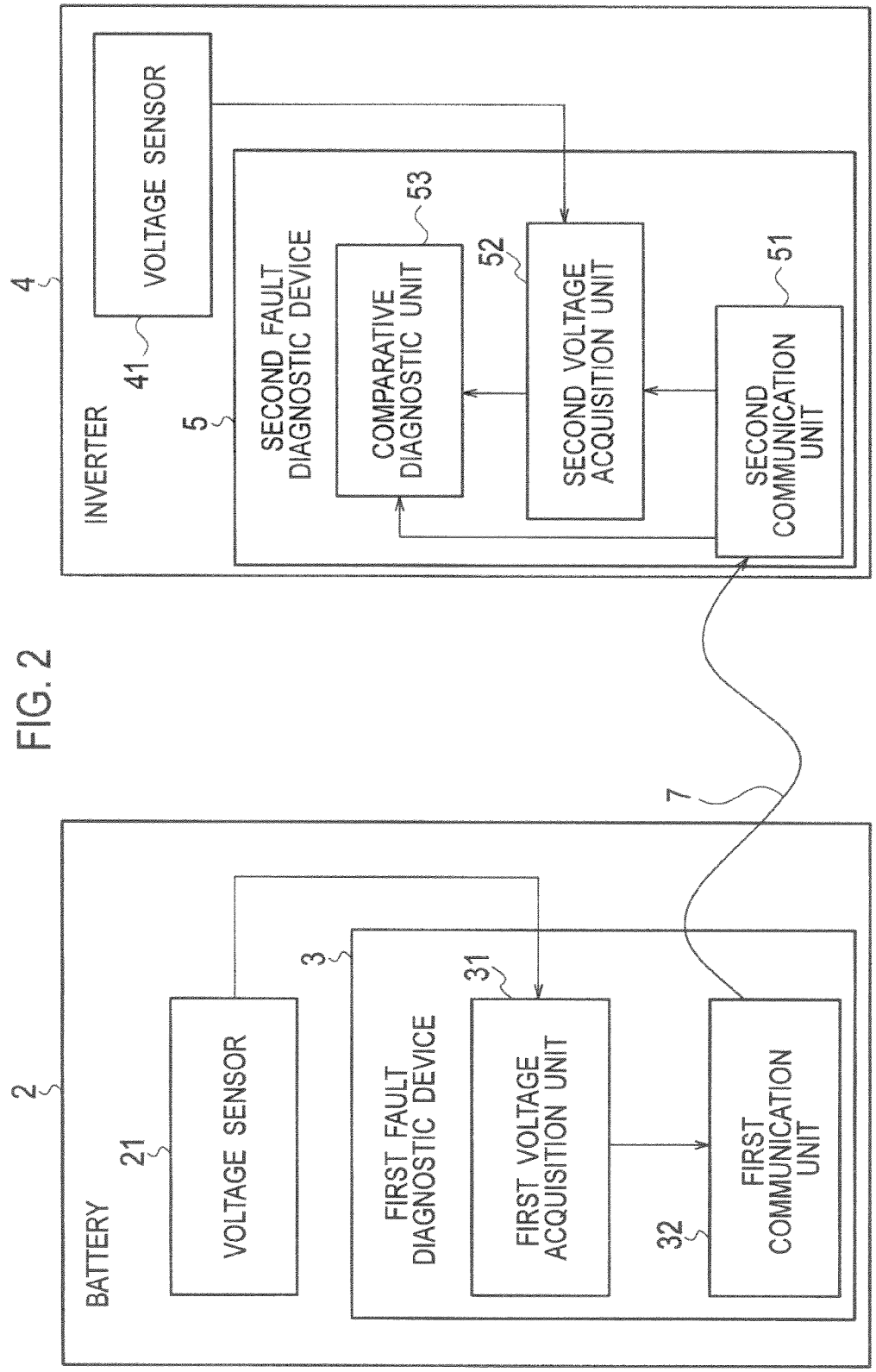
FIG. 2 is a block diagram showing the configurations of first and second fault diagnostic devices constituting the fault diagnostic system according to the first embodiment of the present invention.

Next, the configurations of the first and second fault diagnostic devices 3 and 5 according to this embodiment will be described with reference to FIG. 2. As shown in FIG. 2, the first fault diagnostic device 3 according to this embodiment includes a first voltage acquisition unit (first state quantity acquisition unit) 31 configured to acquire a voltage value from a voltage sensor 21 as a first state quantity indicating the state of the battery 2, and a first communication unit 32 configured to perform communication through the CAN signal line 7.

The second fault diagnostic device 5 includes a second communication unit 51 configured to perform communication through the CAN signal line 7, a second voltage acquisition unit (second state quantity acquisition unit) 52 configured to acquire a voltage value from a voltage sensor 41 as a second state quantity indicating the state of the inverter 4, and a comparative diagnostic unit 53 configured to perform a fault diagnosis by comparing the voltage value of the battery 2 and the voltage value of the inverter 4. It should be noted that the first and second state quantities may be currents or other values other than voltages.

The first and second fault diagnostic devices 3 and 5 include general-purpose electronic circuits including microcomputers, microprocessors, or CPUs and peripheral devices. Further, the first and second fault diagnostic devices 3 and 5 operate as the first and second voltage acquisition units 31 and 52, the first and second communication units 32 and 51, and the comparative diagnostic unit 53 by executing specific programs.

The first voltage acquisition unit 31 generates a synchronization signal, and acquires a voltage value from the voltage sensor 21 at a time of update of this synchronization signal. Then, the first voltage acquisition unit 31 sends the acquired voltage value with the synchronization signal to the first communication unit 32.

The first communication unit 32 sends the voltage value and the synchronization signal received from the first voltage acquisition unit 31 to the second fault diagnostic device 5 through the CAN signal line 7.

The second communication unit 51 receives the voltage value of the battery 2 and the synchronization signal from the first fault diagnostic device 3 through the CAN signal line 7, sends the voltage value and the synchronization signal to the comparative diagnostic unit 53, and sends the synchronization signal to the second voltage acquisition unit 52.

The second voltage acquisition unit 52 acquires a voltage value from the voltage sensor 41 at the time of update of the synchronization signal received by the second communication unit 51. Then, the second voltage acquisition unit 52 sends the acquired voltage value to the comparative diagnostic unit 53.

The comparative diagnostic unit 53 receives the voltage value of the battery 2 and the synchronization signal from the second communication unit 51, and receives the voltage value of the inverter 4 from the second voltage acquisition unit 52. Then, the comparative diagnostic unit 53 matches the acquisition timings of the voltage value of the battery 2 and the voltage value of the inverter 4 on the basis of the synchronization signal, and perform a fault diagnosis by comparing voltage values of the same acquisition timing.

It should be noted that the first fault diagnostic device 3 and the second fault diagnostic device 5 are respectively disposed in the battery 2 and the inverter 4 in this embodiment, but may be reversed. However, it is preferable to dispose the first fault diagnostic device 3 in a device in which a time period from the acquisition of a voltage value to the sending thereof is longer. Cases where the time period from the acquisition of a voltage value to the sending thereof in the battery 2 is longer include the case where the battery 2 has lower priority than the inverter 4 in CAN communications, the case where the battery 2 requires a longer processing time, and the like.

In the case where the first fault diagnostic device 3 is disposed in a device in which the time period from the acquisition of a voltage value to the sending thereof is longer as described above, the device in which the time period to the sending is longer sends a voltage value. Accordingly, the second fault diagnostic device 5 can perform a comparative diagnosis at the same time as receiving the voltage value. Thus, the second fault diagnostic device 5 does not need to provide a margin to the cycle in which a comparative diagnosis is performed, and can repeatedly carry out the fault diagnosis in minimum cycles.

[Procedure of Fault Diagnostic Process]

Next, using the timing chart of FIG. 3, the procedure of a fault diagnostic process performed by the fault diagnostic system 1 according to this embodiment will be described.

First, in step S101, the first voltage acquisition unit 31 acquires the voltage value of the battery 2 from the voltage sensor 21 at the time of update of the synchronization signal. It should be noted that in some cases, when the first voltage acquisition unit 31 acquires the voltage value of the battery 2 from the voltage sensor 21, the first fault diagnostic device 3 cannot immediately send the acquired voltage value of the battery 2 for a reason such as using the acquired voltage value of the battery 2 for a process other than the fault diagnosis inside the first fault diagnostic device 3.

In the case where the first fault diagnostic device 3 cannot immediately send the acquired voltage value of the battery 2 as described above, the first voltage acquisition unit 31 is provided with the function of retaining the acquired voltage value of the battery 2 for a predetermined cycle (e.g., one control cycle).

Next, in step S102, the first voltage acquisition unit 31 sends the acquired voltage value of the battery 2 and the synchronization signal to the first communication unit 32.

After that, in step S103, the first communication unit 32 sends the voltage value of the battery 2 and the synchronization signal through the CAN signal line 7. Then, in step S104, the second communication unit 51 which has received the voltage value of the battery 2 and the synchronization signal sends the voltage value of the battery 2 and the synchronization signal to the comparative diagnostic unit 53. Further, in step S105, the second communication unit 51 sends the synchronization signal to the second voltage acquisition unit 52.

Next, in step S106, the second voltage acquisition unit 52 which has received the synchronization signal acquires the voltage value of the inverter 4 from the voltage sensor 41 at the time of update of the synchronization signal, and sends the voltage value of the inverter 4 to the comparative diagnostic unit 53 in step S107. It should be noted that in the case where the first voltage acquisition unit 31 is provided with the function of retaining the acquired voltage value of the battery 2 for a predetermined cycle, the second voltage acquisition unit 52 is also provided with the function of retaining the voltage value of the inverter 4 acquired from the voltage sensor 41 for a predetermined cycle (equal to the predetermined cycle for the first voltage acquisition unit 31) so that the acquisition timing of a voltage value on the battery 2 side and the acquisition timing of a voltage value on the inverter 4 side may be matched.

Then, in step S108, the comparative diagnostic unit 53 which has received the voltage values of the battery 2 and the inverter 4 and the synchronization signal performs a fault diagnosis by comparing the voltage value of the battery 2 and the voltage value of the inverter 4.

Referring now to FIG. 4, the relationship between the voltage values of the battery 2 and the inverter 4 and the synchronization signal in the above-described fault diagnostic process will be described. As shown in FIG. 4, at time $t_0$, when the synchronization signal is updated on the battery 2 sides, the first voltage acquisition unit 31 acquires $V_0$ as the voltage value $V_B$ of the battery 2 at timing $X_0$ of a fall in this synchronization signal.

After that, the voltage value $V_B$ of the battery 2 and the synchronization signal are sent to the second communication unit 51 of the inverter 4 through the CAN signal line 7. The second communication unit 51 sends the voltage value $V_B$ of the battery 2 and the synchronization signal to the comparative diagnostic unit 53, and sends the synchronization signal to the second voltage acquisition unit 52. Then, at time $t_1$, when the synchronization signal is updated in the second voltage acquisition unit 52 which has received the synchronization signal, the second voltage acquisition unit 52 acquires $V_0$ as the voltage value $V_1$ of the inverter 4 at timing $X_0$ of a fall in the synchronization signal on the inverter side.

Moreover, the comparative diagnostic unit 53 receives, at almost the same time as time $t_1$, the voltage value $V_0$ of the battery 2 and the synchronization signal sent from the second communication unit 51.

Since the voltage value $V_0$ of the inverter 4 is sent from the second voltage acquisition unit 52 to the comparative diagnostic unit 53 immediately after time $t_1$, the comparative diagnostic unit 53 performs a diagnosis at a time of receipt of the voltage value of the inverter 4 by comparing the voltage value of the battery 2 and the voltage value of the inverter 4.

Specifically, the comparative diagnostic unit 53 first matches the acquisition timing of the voltage value of the battery 2 and the acquisition timing of the voltage value of the inverter 4 with reference to the synchronization signal. For example, the voltage value $V_0$ of the battery 2 is found to be a voltage value acquired at timing $X_0$ of the synchronization signal with reference to the synchronization signal. Similarly, the voltage value $V_0$ of the inverter 4 is found to be a voltage value acquired at timing $X_0$ of the synchronization signal with reference to the synchronization signal.

Accordingly, the comparative diagnostic unit 53 performs a comparison between voltage values acquired at timing $X_0$ of the synchronization signal to match the acquisition timings of the voltage values. If these voltage values are equal, the comparative diagnostic unit 53 determines that there is no fault; and, if the voltage values are different, the comparative diagnostic unit 53 determines that there is a fault.

Then, at time $t_2$, the voltage value has already changed to $V_1$, and the synchronization signal is updated on the battery 2 side again. Accordingly, the first voltage acquisition unit 31 acquires $V_1$ as the voltage value $V_B$ of the battery 2. After that, the above-described process is repeatedly performed.

After the fault diagnosis is performed in this way, the fault diagnostic process performed by the fault diagnostic system 1 according to this embodiment is ended.

Effects of First Embodiment

As described in detail above, in the fault diagnostic system 1 according to this embodiment, when a comparison between the voltage value of the battery 2 and the voltage value of the inverter 4 is performed, the acquisition timings of the voltage values are matched on the basis of the synchronization signal, and a fault diagnosis is performed by comparing voltage values of the same acquisition timing. This enables a comparison between voltage values acquired at the same timing to be performed and therefore enables a correct fault diagnosis to be performed.

Moreover, in the fault diagnostic system 1 according to this embodiment, the time period from the acquisition of a voltage value to transmission thereof through the CAN signal line 7 in the battery 2 as the first device is longer than that in the inverter 4 as the second device. Thus, the comparative diagnostic unit 53 does not need to provide a margin to the cycle with which the comparative diagnosis is performed, and can repeatedly carry out the fault diagnosis in minimum cycles.

Further, in the fault diagnostic system 1 according to this embodiment, since the comparative diagnostic unit 53 performs a comparison at a time of acquisition of both of the voltage value of the battery 2 and the voltage value of the inverter 4, a wasted time period from the acquisition of voltage values to the comparative diagnosis can be minimized.

Second Embodiment

Next, a fault diagnostic system according to a second embodiment of the present invention will be described. It should be noted, however, that this embodiment is different from the first embodiment only in the process in the comparative diagnostic unit 53. Accordingly, only the different point will be described.

While the comparative diagnostic unit 53 of the first embodiment performs a comparative diagnosis at a time of receipt of the voltage value of the inverter 4, the comparative diagnostic unit 53 of this embodiment performs a diagnosis at a time of update of the synchronization signal on the inverter 4 side after acquiring the voltage value of the battery 2 and the voltage value of the inverter 4 as shown in FIG. 5 by comparing the voltage value of the battery 2 and the voltage value of the inverter 4.

For example, as shown in FIG. 5, the comparative diagnostic unit 53 according to this embodiment receives the voltage value of the battery 2 and the voltage value of the inverter 4 around time $t_1$, and then performs a voltage value comparison and the fault diagnosis at time $t_3$, when the synchronization signal on the inverter 4 side is updated.

Effects of Second Embodiment

As described in detail above, in the fault diagnostic system according to this embodiment, a comparison is performed at the time of update of the synchronization signal. This enables the comparative diagnostic unit 53 to execute a comparative diagnosis without monitoring the times of receipt of voltage values, and can simplify a program.

Third Embodiment

Next, a fault diagnostic system according to a third embodiment of the present invention will be described.

[Configuration of Fault Diagnostic System]

Figure 6:
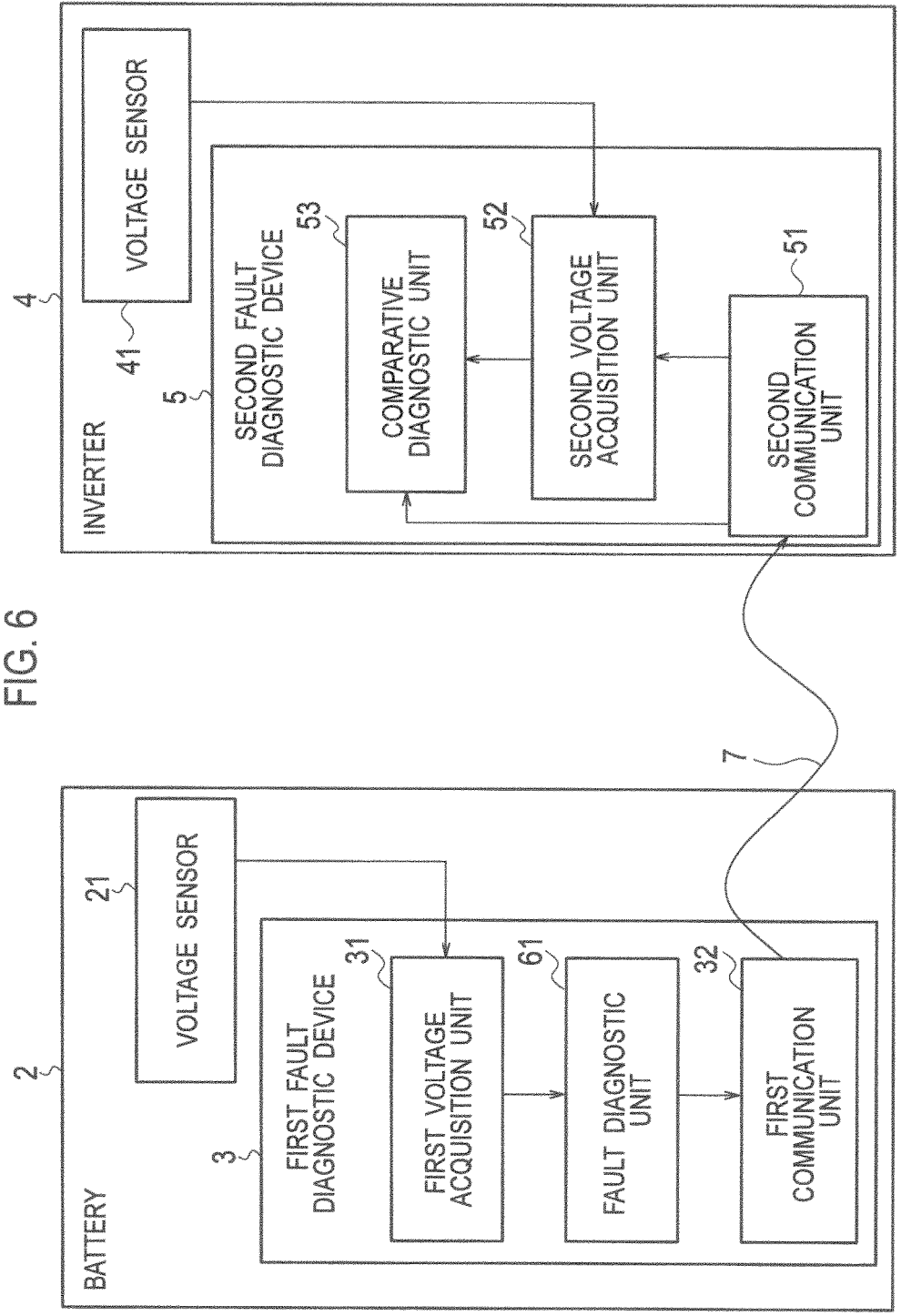
FIG. 6 is a block diagram showing the configurations of first and second fault diagnostic devices constituting a fault diagnostic system according to a third embodiment of the present invention.

FIG. 6 is a block diagram showing the configurations of the first and second fault diagnostic devices 3 and 5 according to this embodiment. As shown in FIG. 6, the first fault diagnostic device 3 according to this embodiment is different from that of the first embodiment in that the first fault diagnostic device 3 further includes a fault diagnostic unit 61 configured to diagnose a fault in the battery 2 by detecting an anomaly in the voltage value of the battery 2.

The fault diagnostic unit 61 determines whether or not the voltage value of the battery 2 acquired by the first voltage acquisition unit 31 is within a normal range, thus diagnosing whether or not the state of the battery 2 is normal. Then, the fault diagnostic unit 61 outputs a diagnosis result signal indicating the result of this diagnosis, and the first communication unit 32 sends the diagnosis result signal to the second fault diagnostic device 5 through the CAN signal line 7. After that, the comparative diagnostic unit 53 which has received the diagnosis result signal cancels the comparative diagnosis if receiving an abnormal diagnosis result through the diagnosis result signal.

Figure 7:
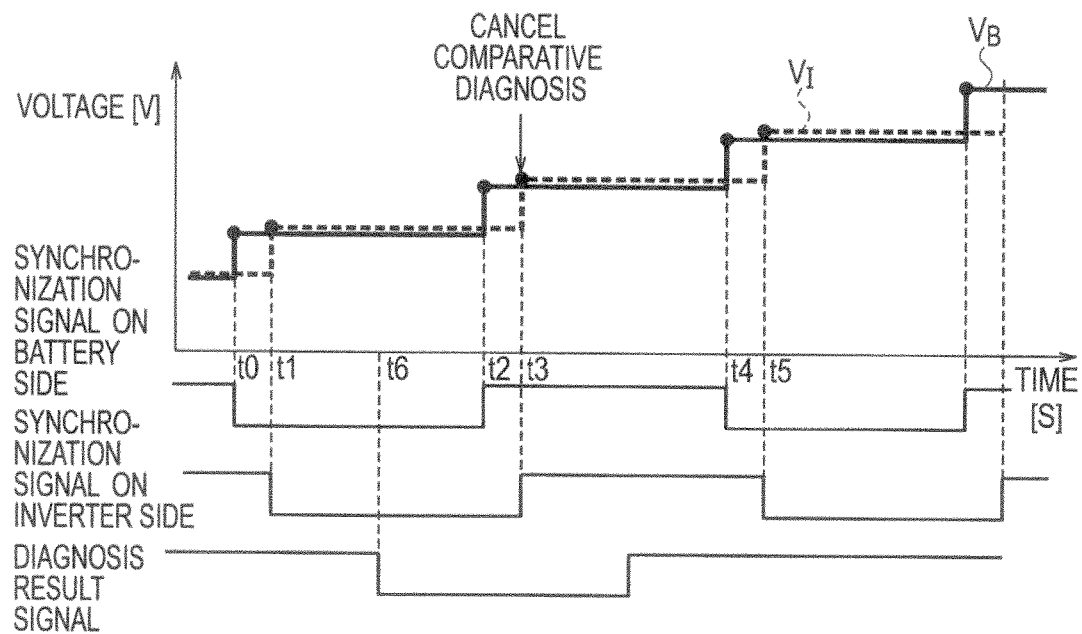
FIG. 7 is a view for explaining the relationship between voltage values of a battery and an inverter and a synchronization signal in a fault diagnostic process according to the third embodiment of the present invention.

Next, the relationship between the voltage values of the battery 2 and the inverter 4 and the synchronization signal in the fault diagnostic process according to this embodiment will be described with reference to FIG. 7.

First, upon receiving the voltage value of the battery 2 from the first voltage acquisition unit 31, the fault diagnostic unit 61 determines whether or not the voltage value of the battery 2 is within the normal range. If detecting an anomaly, the fault diagnostic unit 61 updates the diagnosis result signal, and outputs a signal indicating an anomaly or the possibility of an anomaly. This diagnosis result signal is sent to the comparative diagnostic unit 53. Then, as shown in FIG. 7, at time $t_6$, the diagnosis result signal is updated to a value indicating an anomaly or the possibility of an anomaly. In response to this, the comparative diagnostic unit 53, which normally executes the comparative diagnosis at the time of update of the synchronization signal on the inverter side at time $t_3$, cancels the comparative diagnosis because the diagnosis result signal is indicating an anomaly or the possibility of an anomaly. After that, when the diagnosis result signal returns to normal, the comparative diagnostic unit 53 resumes the comparative diagnosis. It should be noted, however, that the first and second voltage acquisition units 31 and 52 continue to acquire voltages even during a period of cancellation of the comparative diagnosis.

It should be noted that in the case where the comparative diagnosis is performed at the time of receipt of the voltage values of the battery 2 and the inverter 4 as described in the first embodiment, the comparative diagnosis is also canceled when the diagnosis result signal is indicating an anomaly or the possibility of an anomaly.

Effects of Third Embodiment

As described in detail above, the fault diagnostic system according to this embodiment further includes the fault diagnostic unit 61 configured to diagnose a fault in the battery 2 by detecting an anomaly in the voltage value of the battery 2, and the comparative diagnostic unit 53 performs the comparative diagnosis depending on the result of this diagnosis. This enables the comparative diagnosis to be canceled in a situation in which the reliability of the battery 2 is not ensured, and can prevent an incorrect diagnosis caused by a fault in the battery 2.

Moreover, in the fault diagnostic system according to this embodiment, the fault diagnostic unit 61 outputs a diagnosis result signal indicating a diagnosis result, and, if the diagnosis result signal is abnormal, the comparative diagnostic unit 53 cancels the comparative diagnosis. Thus, by sending a dedicated signal different from voltage values and the synchronization signal, the comparative diagnosis can be canceled instantaneously after the detection of a fault in the battery 2.

Fourth Embodiment

Next, a fault diagnostic system according to a fourth embodiment of the present invention will be described. It should be noted, however, that in this embodiment, the configuration of the fault diagnostic system is the same as that of the third embodiment, and therefore a detailed description thereof will be omitted.

In the third embodiment, the fault diagnostic unit 61 outputs a diagnosis result signal upon detecting an anomaly in the voltage value of the battery 2; whereas, in this embodiment, the fault diagnostic unit 61 changes the voltage value of the battery 2 to an invalid value upon detecting an anomaly. Although the voltage value of the battery 2 is generally 380 to 420 V, the fault diagnostic unit 61 changes the voltage value of the battery 2 to an invalid value greatly exceeding this range, e.g., 0 V or 800 V. Then, the changed voltage value of the battery 2 is sent with the synchronization signal to the comparative diagnostic unit 53.

Figure 8:
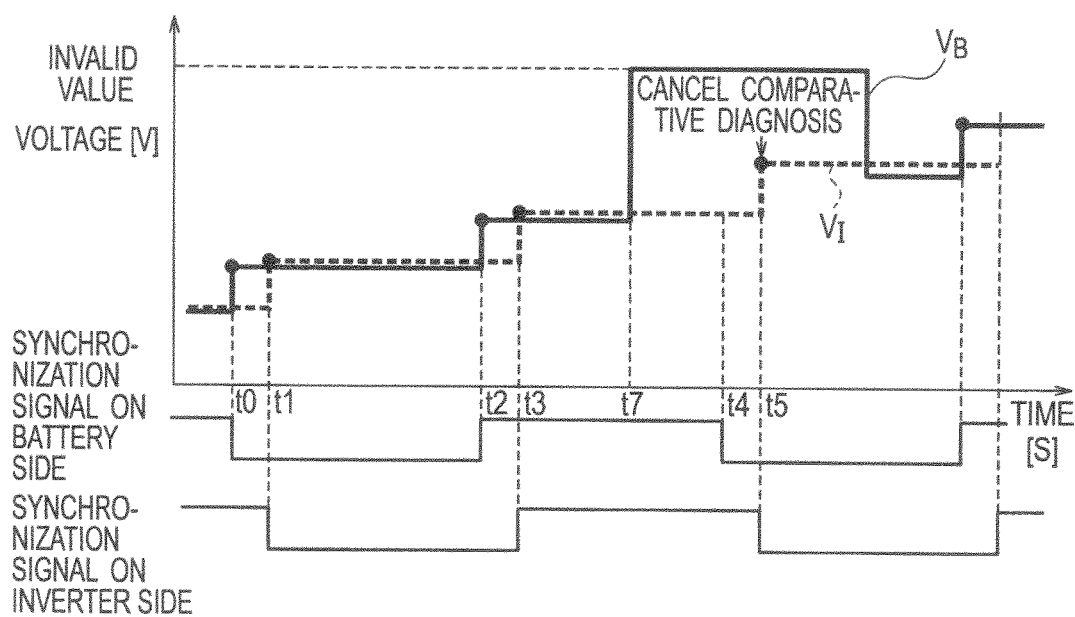
FIG. 8 is a view for explaining the relationship between voltage values of a battery and an inverter and a synchronization signal in a fault diagnostic process according to a fourth embodiment of the present invention.

For example, as shown in FIG. 8, the fault diagnostic unit 61 changes the voltage value of the battery 2 acquired by the first voltage acquisition unit 31 to an invalid value when detecting an anomaly. FIG. 8 shows the case where a change to a value greater than normal values as an invalid value is made.

Then, at time $t_7$, when the received voltage value of the battery 2 becomes an invalid value in the comparative diagnostic unit 53, the comparative diagnostic unit 53 cancels the comparative diagnosis. For example, in FIG. 8, though the comparative diagnosis has been supposed to be carried out at the time of update of the synchronization signal on the inverter side at time $t_5$, the comparative diagnostic unit 53 cancels the comparative diagnosis because the voltage value of the battery 2 is an invalid value. After that, when the voltage value of the battery 2 returns to normal, the comparative diagnostic unit 53 resumes the comparative diagnosis.

Effects of Fourth Embodiment

As described in detail above, in the fault diagnostic system according to this embodiment, if the result of the diagnosis made by the fault diagnostic unit 61 is abnormal, the voltage value of the battery 2 is changed to an invalid value. This can prevent an incorrect diagnosis caused by a fault in the battery 2 without newly adding a signal for sending the result of the fault diagnosis.

Fifth Embodiment

Next, a fault diagnostic system according to a fifth embodiment of the present invention will be described. It should be noted, however, that in this embodiment, the configuration of the fault diagnostic system is the same as that of the third embodiment, and therefore a detailed description thereof will be omitted.

In this embodiment, upon detecting an anomaly in the voltage value of the battery 2, the fault diagnostic unit 61 stops the update of the synchronization signal, and sends to the first communication unit 32 the synchronization signal in which updating is stopped.

Figure 9:
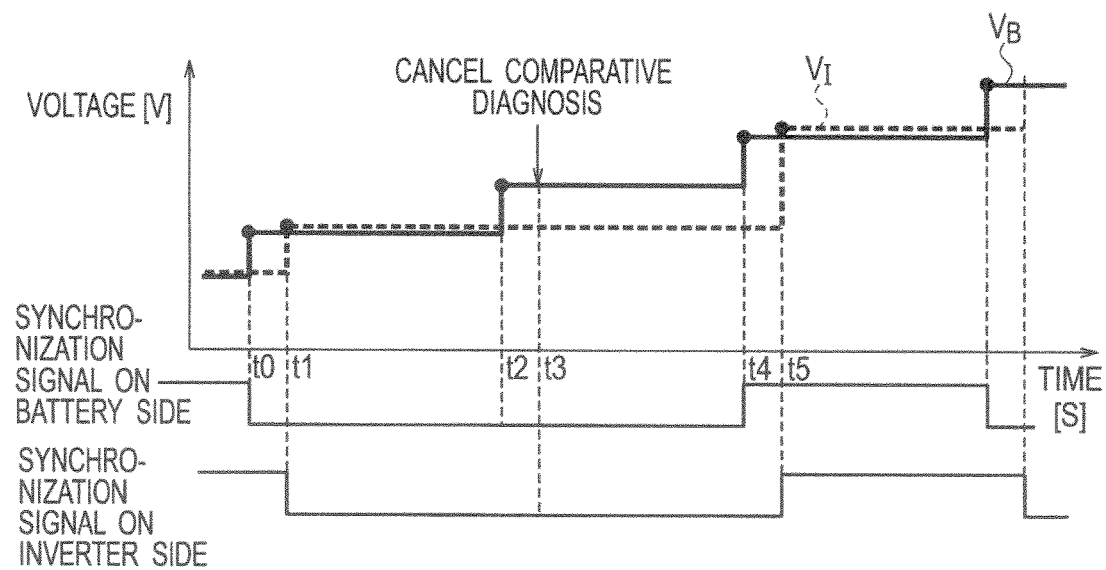
FIG. 9 is a view for explaining the relationship between voltage values of a battery and an inverter and a synchronization signal in a fault diagnostic process according to a fifth embodiment of the present invention.

For example, as shown in FIG. 9, when detecting an anomaly, the fault diagnostic unit 61 changes the synchronization signal so that the update of the synchronization signal at time $t_2$ may be stopped, and sends the changed synchronization signal to the first communication unit 32. It should be noted, however, that in the first voltage acquisition unit 31, when the synchronization signal is generated, the synchronization signal is normally updated, and therefore the voltage value of the battery 2 is acquired. On the other hand, in the second voltage acquisition unit 52, since the received synchronization signal is not updated at time $t_3$, the voltage value of the inverter 4 is not acquired. Then, in the comparative diagnostic unit 53, since the synchronization signal is not updated at time $t_3$, the comparative diagnosis is canceled.

Figure 10:
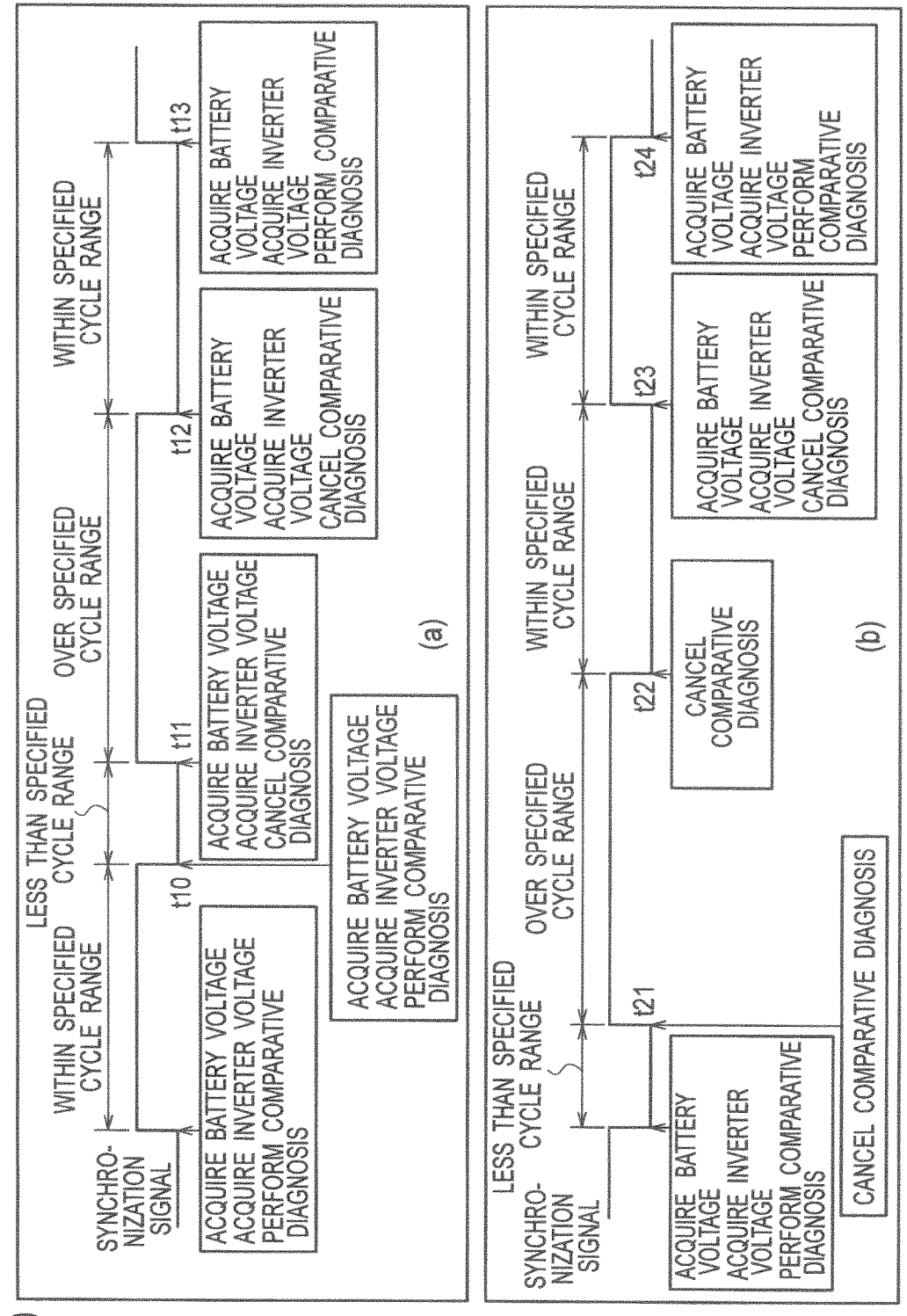
FIG. 10 is a view for explaining the execution and non-execution of a comparative diagnosis in the fault diagnostic process according to the fifth embodiment of the present invention.

Further, the comparative diagnostic unit 53 also cancels the comparative diagnosis in the case where the synchronization signal is updated outside a specified cycle range set in advance. For example, as shown in FIG. 10A, while the comparative diagnosis is carried out at time $t_{10}$ because the synchronization signal is updated within the specified cycle range, the comparative diagnosis is canceled at time $t_{11}$ because the synchronization signal is updated in a short cycle less than the specified cycle range. Moreover, the comparative diagnosis is also canceled at time $t_{12}$ because the synchronization signal is updated in a cycle longer than the specified cycle range. After that, at time $t_{13}$, in response to return to the specified cycle range, the comparative diagnostic unit 53 resumes the comparative diagnosis.

Moreover, another method may be employed in which as shown in FIG. 10B, the acquisition of voltage values, as well as the comparative diagnosis, is canceled if the synchronization signal is updated outside the specified cycle range. In FIG. 10B, at time $t_{21}$, not only the comparative diagnosis but also the acquisition of voltages is canceled because the synchronization signal is updated in a short cycle less than the specified cycle range. Similarly, at time $t_{22}$, the comparative diagnosis and the acquisition of voltages are also canceled because the synchronization signal is updated in a cycle longer than the specified cycle range. Then, at time $t_{23}$, when the synchronization signal is updated within the specified cycle range for the first time, only the acquisition of voltages is performed, but the comparative diagnosis is canceled. At time $t_{24}$, when the synchronization signal is updated within the specified cycle range for the second time, both of the acquisition of voltages and the comparative diagnosis are carried out.

Effects of Fifth Embodiment

As described in detail above, in the fault diagnostic system according to this embodiment, the update of the synchronization signal is stopped if the result of a diagnosis made by the fault diagnostic unit 61 is abnormal, and the comparative diagnostic unit 53 does not perform the comparative diagnosis if the synchronization signal is updated outside the specified cycle range set in advance. This can prevent an incorrect diagnosis caused by a fault in the battery 2 without newly adding a signal for sending the result of the fault diagnosis.

Sixth Embodiment

Next, a fault diagnostic system according to a sixth embodiment of the present invention will be described. In the fault diagnostic system according to this embodiment, the case where the time period from the acquisition of a voltage value to transmission thereof through the CAN signal line 7 in the inverter 4 is longer than that in the battery 2 will be described.

Figure 11:
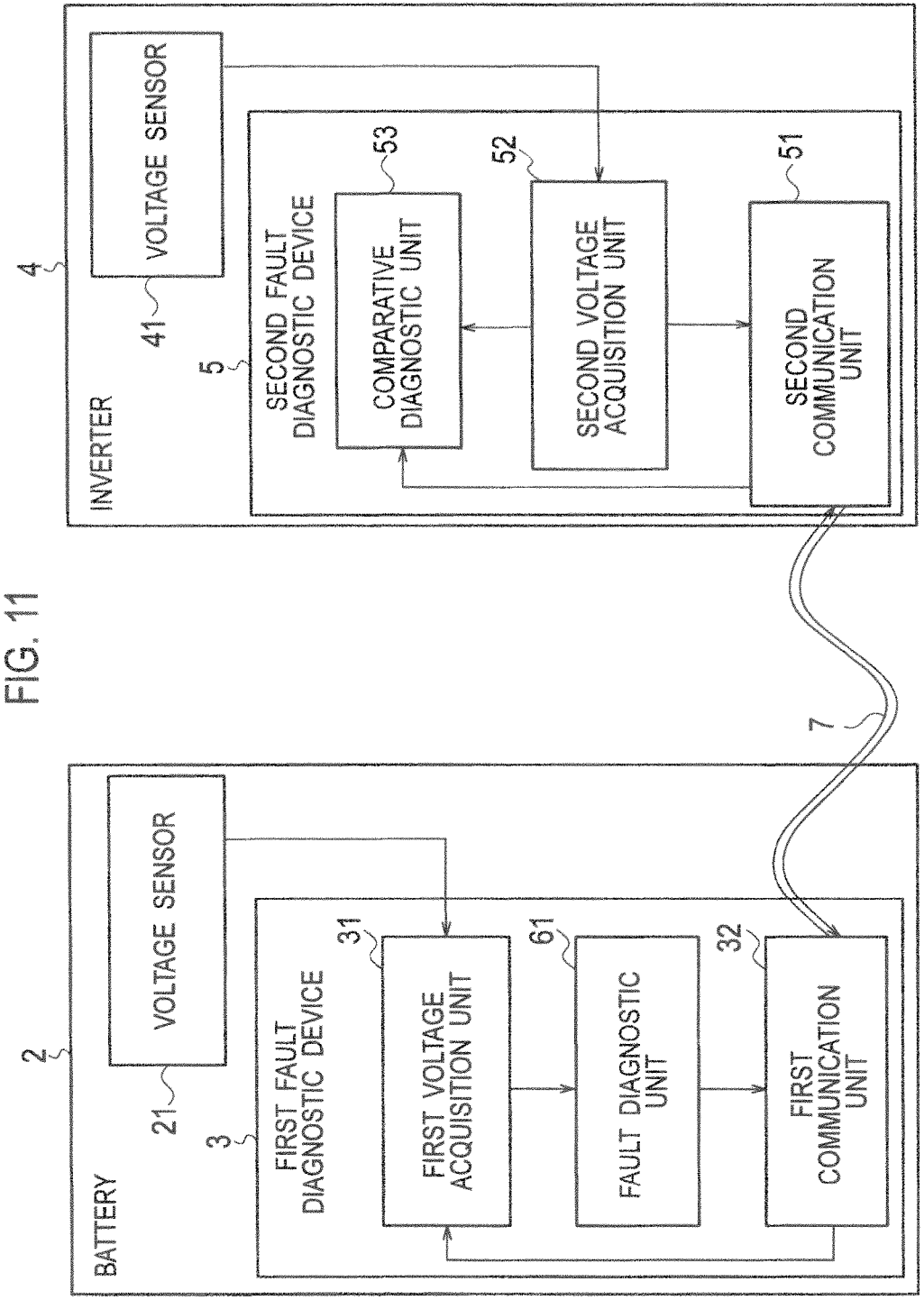
FIG. 11 is a block diagram showing the configurations of first and second fault diagnostic devices constituting a fault diagnostic system according to a sixth embodiment of the present invention.

In that case, as shown in FIG. 11, the second voltage acquisition unit 52 on the inverter side generates a synchronization signal and sends the synchronization signal to the first voltage acquisition unit 31 on the battery side. In the first voltage acquisition unit 31, the voltage value of the battery 2 is acquired at the time of update of the synchronization signal sent thereto and sent to the inverter 4 through the first communication unit 32.

The comparative diagnostic unit 53 of the inverter 4 receives the voltage value of the battery 2 sent from the first voltage acquisition unit 31 and receives the voltage value of the inverter 4 and the synchronization signal sent from the second voltage acquisition unit 52. Then, the comparative diagnostic unit 53 matches the acquisition timings of the voltage values on the basis of the synchronization signal, and perform a comparison between these voltage values. If the voltage values are equal, the comparative diagnostic unit 53 determines that there is no fault; whereas, if the voltage values are different, the comparative diagnostic unit 53 determines that there is a fault.

As described above, the fault diagnostic system according to this embodiment can perform a correct fault diagnosis by comparing voltage values acquired at the same timing even in the case where the time period from the acquisition of a voltage value to transmission thereof in the inverter 4 is longer.

While embodiments of the present invention have been described above, the descriptions and drawings constituting part of the present disclosure should not be construed as limiting the present invention. From the present disclosure, various alternative embodiments, examples, and practical techniques will be apparent to those skilled in the art.

The present application claims the benefit of priority to Japanese Patent Application No. 2012-161423, filed on Jul. 20, 2012, the contents of which are incorporated herein by reference.

INDUSTRIAL APPLICABILITY

With a fault diagnostic system, a fault diagnostic device, and a fault diagnostic method according to one aspect of the present invention, a synchronization signal is sent from a first device to a second device, and the second device matches the acquisition timings of a first state quantity and a second state quantity on the basis of the received synchronization signal. Further, a fault diagnosis is performed by comparing the first state quantity and the second state quantity of the same acquisition timing. This enables pieces of data acquired at the same timing to be compared and therefore enables a correct fault diagnosis to be performed. Accordingly, the fault diagnostic system, the fault diagnostic device, and the fault diagnostic method according to one aspect of the present invention have industrial applicability.

REFERENCE SIGNS LIST

1 FAULT DIAGNOSTIC SYSTEM
2 BATTERY
3 FIRST FAULT DIAGNOSTIC DEVICE
4 INVERTER
5 SECOND FAULT DIAGNOSTIC DEVICE
6 MOTOR
7 CAN SIGNAL LINE
21, 41 VOLTAGE SENSOR
31 FIRST VOLTAGE ACQUISITION UNIT (FIRST STATE QUANTITY ACQUISITION UNIT)
32 FIRST COMMUNICATION UNIT
51 SECOND COMMUNICATION UNIT
52 SECOND VOLTAGE ACQUISITION UNIT (SECOND STATE QUANTITY ACQUISITION UNIT)
53 COMPARATIVE DIAGNOSTIC UNIT
61 FAULT DIAGNOSTIC UNIT

The invention claimed is:

1. A fault diagnostic system for diagnosing a fault in a battery and an inverter connected by a communication line, comprising:
   a first fault diagnostic device comprising:
      a first state quantity acquisition unit configured to acquire a voltage value of the battery indicating a state of the battery in accordance with a synchronization signal; and
      a first communication unit configured to send the voltage value of the battery and the synchronization signal through the communication line; and
   a second fault diagnostic device comprising:
      a second communication unit configured to receive the voltage value of the battery and the synchronization signal through the communication line;
      a second state quantity acquisition unit configured to acquire a voltage value of the inverter indicating a state of the inverter in accordance with the synchronization signal received by the second communication unit; and
      a comparative diagnostic unit configured to match acquisition timings of the voltage value of the battery and the voltage value of the inverter based on the synchronization signal received by the second communication unit, and perform a fault diagnosis by comparing the voltage value of the battery with the voltage value of the inverter of a same acquisition timing.

2. The fault diagnostic system according to claim 1, wherein a time period from acquisition of the voltage value of the battery to transmission of the voltage value of the battery through the communication line in the battery is longer than a time period from acquisition of the voltage value of the inverter to sending of the voltage value of the inverter to the comparative diagnostic unit in the inverter.

3. The fault diagnostic system according to claim 1, wherein the comparative diagnostic unit performs the fault diagnosis by comparing at a time of acquisition of both of the voltage value of the battery and the voltage value of the inverter.

4. The fault diagnostic system according to claim 1, wherein the comparative diagnostic unit performs the fault diagnosis at a time of update of the synchronization signal received by the second communication unit by comparing the voltage value of the battery and the voltage value of the inverter.

5. The fault diagnostic system according to claim 1, wherein the first fault diagnostic device further comprises a fault diagnostic unit configured to diagnose a fault in the battery by detecting an anomaly in the voltage value of the battery, and
   the comparative diagnostic unit performs a comparative diagnosis depending on a diagnosis result of the fault diagnostic unit.

6. The fault diagnostic system according to claim 5, wherein the fault diagnostic unit outputs a diagnosis result signal indicating the diagnosis result, and
   the comparative diagnostic unit cancels the comparative diagnosis when receiving an abnormal diagnosis result by the diagnosis result signal.

7. The fault diagnostic system according to claim 5, wherein the fault diagnostic unit changes the voltage value of the battery to an invalid value when the diagnosis result is abnormal, and
   the comparative diagnostic unit cancels the comparative diagnosis when the voltage value of the battery is the invalid value.

8. The fault diagnostic system according to claim 5, wherein the fault diagnostic unit stops updating the synchronization signal when the diagnosis result is abnormal, and
   the comparative diagnostic unit cancels the comparative diagnosis when the synchronization signal received by the second communication unit is updated outside a specified cycle range set in advance.

9. A fault diagnostic device provided in a fault diagnostic system to diagnose a fault in a battery and an inverter connected by a communication line, the fault diagnostic device comprising:
   a communication unit configured to receive a synchronization signal and a voltage value of the battery indicating a state of the battery, the voltage value of the battery being acquired in accordance with the synchronization signal in the battery;
   a second state quantity acquisition unit configured to acquire a voltage value of the inverter indicating a state of the inverter in accordance with the synchronization signal received by the communication unit; and
   a comparative diagnostic unit configured to match acquisition timings of the voltage value of the battery and the voltage value of the inverter based on the synchronization signal received by the communication unit, and perform a fault diagnosis by comparing the voltage value of the battery with the voltage value of the inverter of a same acquisition timing.

10. A fault diagnostic method for a fault diagnostic system for diagnosing a fault in a battery and an inverter connected by a communication line, the fault diagnostic method comprising:
   acquiring a voltage value of the battery indicating a state of the battery in accordance with a synchronization signal;
   sending the voltage value of the battery and the synchronization signal to the inverter through the communication line;
   receiving the voltage value of the battery and the synchronization signal at the inverter through the communication line;
   acquiring a voltage value of the inverter indicating a state of the inverter in accordance with the received synchronization signal; and
   matching acquisition timings of the voltage value of the battery and the voltage value of the inverter based on the received synchronization signal, and performing a fault diagnosis by comparing the voltage value of the battery with the voltage value of the inverter of a same acquisition timing.

11. A fault diagnostic system for diagnosing a fault in a battery and an inverter connected by a communication line, comprising:

a first fault diagnostic device comprising:
  a first state quantity acquisition means for acquiring a voltage value of the battery indicating a state of the battery in accordance with a synchronization signal; and
  a first communication means for sending the voltage value of the battery and the synchronization signal through the communication line; and a second fault diagnostic device comprising:
  a second communication means for receiving the voltage value of the battery and the synchronization signal through the communication line;
  a second state quantity acquisition means for acquiring a voltage value of the inverter indicating a state of the inverter in accordance with the synchronization signal received by the second communication means; and
  a comparative diagnosis means for matching acquisition timings of the voltage value of the battery and the voltage value of the inverter based on the synchronization signal received by the second communication means, and performing a fault diagnosis by comparing the voltage value of the battery with the voltage value of the inverter of a same acquisition timing.

12. A fault diagnostic device provided in a fault diagnostic system to diagnose a fault in a battery and an inverter connected by a communication line, the fault diagnostic device comprising:

a communication means for receiving a synchronization signal and a voltage value of the battery indicating a state of the battery, the voltage value of the battery being acquired in accordance with the synchronization signal in the battery;

a second state quantity acquisition means for acquiring a voltage value of the inverter indicating a state of the inverter in accordance with the synchronization signal received by the communication means; and a comparative diagnosis means for matching acquisition timings of the voltage value of the battery and the voltage value of the inverter based on the synchronization signal received by the communication means, and performing a fault diagnosis by comparing the voltage value of the battery with the voltage value of the inverter of a same acquisition timing.

* * * * *